(12) United States Patent
Smith et al.

(10) Patent No.: US 6,973,145 B1
(45) Date of Patent: Dec. 6, 2005

(54) DIGITAL-DATA RECEIVER SYNCHRONIZATION METHOD AND APPARATUS

(75) Inventors: Stephen F. Smith, Loudon, TN (US); Gary W. Turner, Clinton, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 704 days.

(21) Appl. No.: 09/653,788

(22) Filed: Sep. 1, 2000

(51) Int. Cl.[7] .............................. H04L 7/00; H03D 3/24
(52) U.S. Cl. ...................................... 375/354; 375/376
(58) Field of Search ................................ 375/354, 355, 375/373, 376, 327, 294; 329/325; 327/147, 327/156; 342/103

(56) References Cited

U.S. PATENT DOCUMENTS

| | | | |
|---|---|---|---|
| 3,341,658 A | 9/1967 | Kaneko | |
| 3,491,338 A | 1/1970 | Malloy | |
| 3,633,115 A | 1/1972 | Epstein | |
| 3,723,718 A * | 3/1973 | Jaffe et al. .......................... 703/4 |
| 3,873,931 A | 3/1975 | Basse et al. | |
| 4,091,331 A | 5/1978 | Kaser et al. | |
| 4,234,852 A | 11/1980 | McCorkle | |
| 4,545,061 A | 10/1985 | Hileman | |
| 4,780,891 A | 10/1988 | Guerin et al. | |
| 5,105,168 A * | 4/1992 | DaSilva ........................ 331/2 |
| 5,251,237 A | 10/1993 | Baier | |
| 5,367,536 A | 11/1994 | Tsujimoto | |
| 5,402,450 A | 3/1995 | Lennen | |
| 5,493,583 A | 2/1996 | Cripps | |
| 5,519,444 A | 5/1996 | Ko et al. | |
| 5,568,078 A * | 10/1996 | Lee ............................. 327/262 |
| 5,717,730 A * | 2/1998 | Prakash et al. ............. 375/376 |
| 5,739,727 A | 4/1998 | Lofter et al. | |
| 5,825,805 A | 10/1998 | Kato | |
| 5,832,045 A | 11/1998 | Barber | |
| 5,838,741 A | 11/1998 | Callaway, Jr. et al. | |
| 6,239,729 B1 * | 5/2001 | Takeuchi .................... 341/100 |
| 6,469,550 B1 * | 10/2002 | Kurd .......................... 327/141 |

FOREIGN PATENT DOCUMENTS

| | | |
|---|---|---|
| DE | 29512779 U1 | 9/1995 |
| WO | WO 02/19550 A2 | 7/2002 |

OTHER PUBLICATIONS

International Search Report for PCT/US01/27188, Mar. 21, 2002.

* cited by examiner

*Primary Examiner*—Khai Tran
(74) *Attorney, Agent, or Firm*—John Bruckner PC

(57) ABSTRACT

Digital-data receiver synchronization is provided with composite phase-frequency detectors, mutually cross-connected comparison feedback or both to provide robust reception of digital data signals. A single master clock may be used to provide frequency signals. Advantages can include fast lock-up time in moderately to severely noisy conditions, greater tolerance to noise and jitter when locked, and improved tolerance to clock asymmetries.

10 Claims, 8 Drawing Sheets

Fig. 1 [Prior Art]

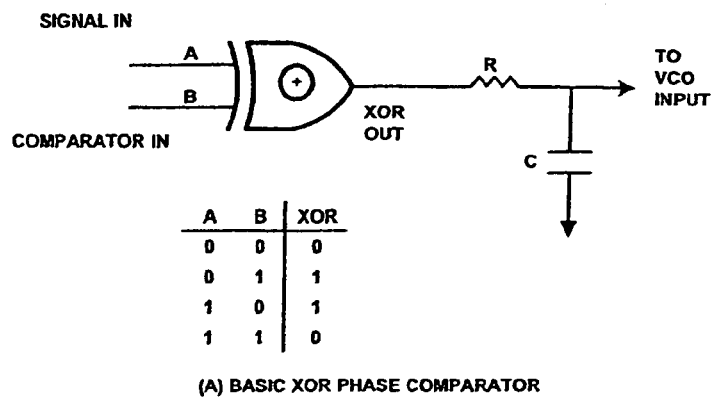
(A) BASIC XOR PHASE COMPARATOR
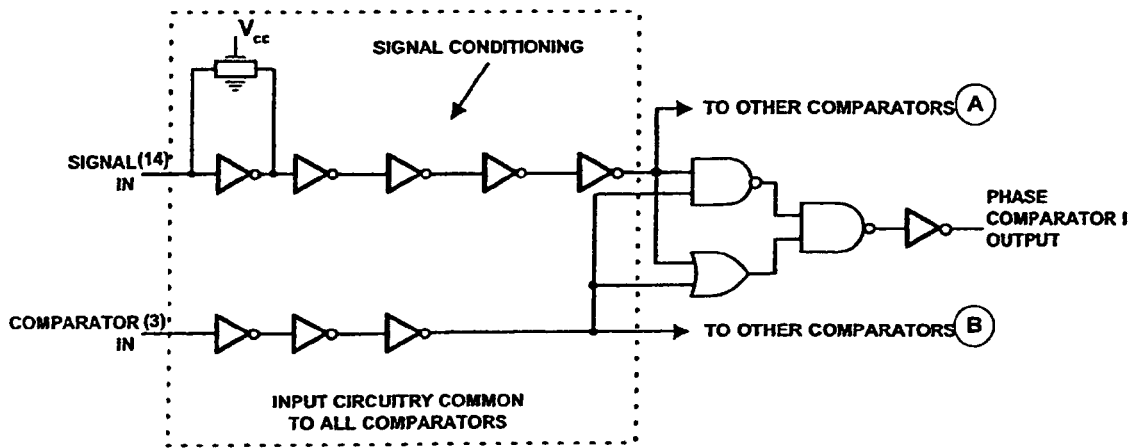
(B) DETAILED ON-CHIP IC CIRCUITRY IN 74HC4046
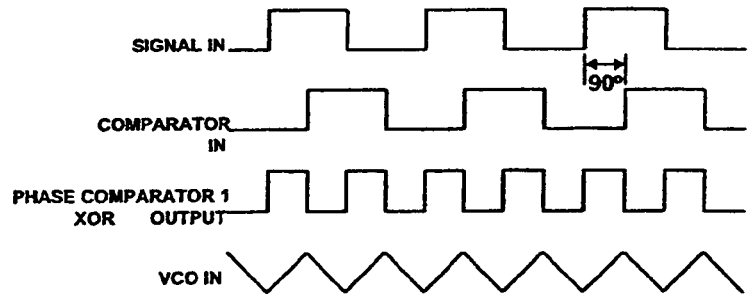
(C) TYPICAL XOR DETECTOR WAVEFORMS
Fig. 4 (Prior Art)

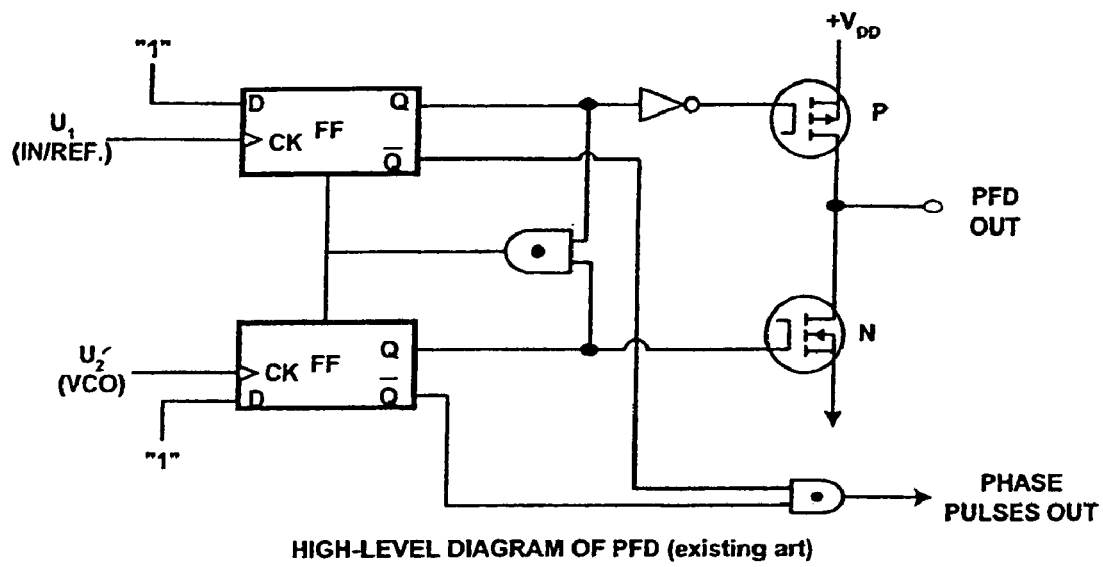
HIGH-LEVEL DIAGRAM OF PFD (existing art)
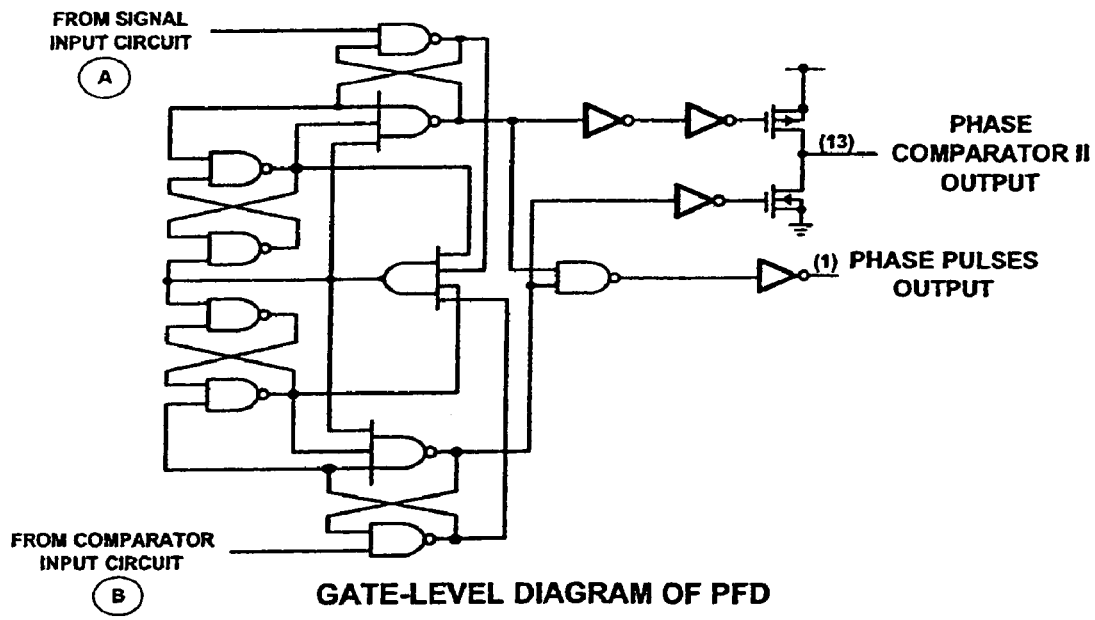
GATE-LEVEL DIAGRAM OF PFD
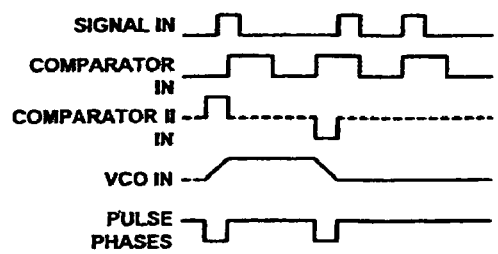
TIMING AND WAVEFORMS OF PFD (existing art)
Fig. 4 cont. (Prior Art)

DIGITAL-DATA RECEIVER SYNCHRONIZATION METHOD AND APPARATUS

STATEMENT AS TO RIGHTS TO INVENTIONS MADE UNDER FEDERALLY-SPONSORED RESEARCH OR DEVELOPMENT

This invention was made with United States Government support under prime contract No. DE-AC05-00OR22725 to UT-Battelle, L.L.C. awarded by the Department of Energy. The Government has certain rights in this invention.

FIELD OF THE INVENTION

The current invention relates generally to digital-data receivers, and particularly to an improved digital-data receiver using multiple cross-coupled synchronization loops.

BACKGROUND OF THE INVENTION

1. Field of the Invention

Most digital transmitter devices utilize separate frequency-reference sources (e.g., crystal oscillators, SAW resonators, etc.) to determine the various parameters of transmission such as RF carrier frequency, data-transmission bit (baud) rate, data-burst timing, and interface data rates (e.g., serial data input speeds). Even in frequency-synthesized units, one or more crystals are invariably used to set not only the carrier center frequencies, but also channel step sizes and the like. In digital systems incorporating data-acquisition functions, the required A/D converters are often run at independently selected rates dictated by the specific application. Additionally, in the typical modern system implementations employing embedded microprocessors or microcontrollers, there is also a separate clock used to drive the processor which is based on the chip's instruction-cycle times.

As a result, there are usually a multiplicity of relatively unrelated clocks running in the unit which can generate varying levels of mutual interferences due to the "beat" or difference in frequencies between the sources. This problem can be particularly troublesome when clock signals cross-couple via capacitive or radiating means into sensitive low-level analog signal inputs, synthesizer loop-control lines (causing spurious RF emissions), or modulation-signal wiring (causing modulation noise, instabilities, or nonlinearities).

Interestingly, the solution to the aforementioned problem of multiple unrelated clocks and the resultant variable noise and "beat" interactions—fully synchronous system clocking—can also produce a major performance benefit in the implementation of digital data receivers for lower-quality channels. Since virtually all data streams are organized with integrally related numbers of data bits, words, frames, and burst lengths, the fixed, well defined relationships between these rates or frequencies can be exploited to provide additional mechanisms to achieve faster and more robust synchronization to these components, both in acquisition and tracking contexts.

2. Description of Related Art

There are a large number of patents, textbooks, and articles in the literature devoted to the general subject of phase-locked loop (PLL) technology. There have been dozens of patents issued on various aspects of the PLL, including a variety of circuits for loop phase detection, both analog and digital in implementation. The particular aspect of PLL technology considered herein is the performance of PLLs in receiver synchronization, especially in the noisy or distorted-channel conditions (e.g., interference, fading, and/or multipath scenarios) which are far more characteristic of real RF links than the highly idealized case of simple additive white Gaussian noise (AWGN). Invariably, RF circuits are initially analyzed for their performance in a pure AWGN channel due to the simpler (statistical) mathematics; see, for example, *Digital Communications, Third Edition*, by John G. Proakis, 1995. The performance (i.e., bit error rate versus signal-to-noise ratio) of most demodulators in fading and multipath (dispersive) environments is substantially worse than in pure-AWGN channels, is much more difficult to analyze, and in practice requires significantly more finesse to achieve good link performance. Indeed, most of the mathematical simulations of fading channels are made assuming perfect receiver synchronization is somehow achieved; unfortunately, this in reality is unjustifiably optimistic. At low signal-to-noise ratios (SNRs), synchronization quality can become a dominant factor in the overall receiver bit error rate (BER) performance level. Thus, improved methods of receiver synchronization for use in poorer-grade RF communications channels are needed to elevate wireless system BER performance levels, provide more uniform coverage (particularly in rough terrain), and accommodate greater numbers of users. A survey of the existing patent art will further clarify this need.

U.S. Pat. No. 4,091,331, issued May 23, 1978 to Hans-Peter Kaser, et al, discloses a method to compensate RF carrier phase errors by tracking the carrier with a feedback loop incorporating a phase-error predictor. A means for optimizing the gain of the phase-estimator loop circuit is provided by processing the successive bit-by-bit residual phase errors ($\Delta\phi_n$, $\Delta\phi_{n+1}$). This patent describes an adaptive-gain algorithm to optimize the phase tracking of a receiver during changing reception conditions, where the ratio of carrier phase jitter to Gaussian noise is varying due to dynamic RF transmission channel characteristics. If successive phase-error variance samples are uncorrelated (i.e., $\text{avg}[Df_n, Df_{n+1}]=0$) the loop gain is optimum; if the correlation result is >0, then the loop gain must be increased; and if the correlation is <0, the gain must be reduced. This patent clearly does not describe multiple interconnected phase detectors or PLLs; it therefore has no bearing on the instant invention.

U.S. Pat. No. 5,251,237, issued Oct. 5, 1993 to Alfred Baier, discloses a method of dynamic channel data-quality assessment principally using measurements of the channel impulse response and the total power therein to estimate the degree of dispersion in the time-multiplexed European "GSM" cellular-phone link. The effective dispersion time of the multiple reflected signals is computed, as is the time distribution of the total slot signal power. From this estimate, parameters of adaptive equalizers and/or maximum-likelihood (Viterbi-type) data decoders are adjusted to provide acceptable BER performance. To conserve power in battery-operated cell-phone transceivers, the degree of signal processing is dynamically minimized; when the channel is good, the extra processing hardware is switched off to extend battery life. This scheme is directed solely at time-division multiplexed systems (e.g., GSM) and is not broadly applicable to other types of systems such as spread-spectrum. Further, this patent makes no mention of PLL-based systems (single or multiple) and has no applicability to synchronization methods. Thus there is no commonality with the instant application.

U.S. Pat. No. 5,367,536, issued Nov. 22, 1994 to Ichiro Tsujimoto, describes a method in time-division multiple-access (TDMA) systems of transmitting concurrent sync and data bursts by differentially encoding the data to produce a spectral null near the RF carrier when modulated; conversely, the more bandlimited sync burst is directly modulated onto the carrier and thus occupies the spectral region immediately straddling the carrier frequency. Since the sync and data signal spectra are not overlapping, the receiver can separate out the sync components via a simple bandpass filter and recover a clean data-clock therefrom. In parallel, the data signal is corrected by a standard decision-feedback equalizer to filter out the sync components and subsequently demodulated; timing for these latter operations is obtained from the recovered sync-derived clock. This patent, although useful for its intended applications, does not involve any type of PLL circuitry and clearly employs very conventional techniques for extracting data clock from the received sync burst. No use of multiple PLL detectors or loops is mentioned. There is thus no overlap with the instant invention.

U.S. Pat. No. 5,838,741, issued Nov. 17, 1998 to Edgar Callaway, Jr. et al, discloses a scheme that ensures that digital data in an RF receiver is transferred to downstream stages only at times which will have minimal impact (e.g., from radiated or conducted noise) on the front-end and other more sensitive parts of the circuit. The scheme is generally applicable to miniature units and particularly relevant to single-chip (monolithic) devices. The salient goal is to minimize on-chip data transfers (with their inherent noise) during any critical signal-sampling instants, delaying them to less sensitive times. The system controller can be configured to insert an optimum delay into the various subsystem control lines to avoid logic transitions at noise-critical times for the various circuits. Although the techniques herein are useful for the manufacture of receiver hardware, they only deal with noise generated internal to the receiver itself and do not in any way address RF link noise and degradations affecting the input signal from the antenna. Thus this patent and the instant invention deal with totally different problems and therefore are not intersecting in scope.

U.S. Pat. No. 5,832,045, issued Nov. 3, 1998 to Andrew Barber, discloses a method and apparatus to adjust data-bit (baud) timing through a correlation assessment of intersymbol interference (ISI) induced by imperfections in the data link. This patent is directed at improved methods of generating baud (bit) timing for applications such as high symbol-rate data modems for telephone lines, where better precision in establishing bit timing is critical to high data throughputs with low errors. The invention improves timing resolution over existing carrier-envelope detection and simple bit-energy correlation methods by correlating successively adjacent (immediately leading and trailing) bits to provide a simple but accurate bipolar error signal which is then used to adjust the timing of the bit sampler which drives the correlators. This "early-late" scheme is similar in concept to spread-spectrum polynomial correlators widely employed in direct-sequence systems, but here simply functions as the phase-error detector in a conventional PLL setup. The application of this technique is never extended to recovering multiple clock frequencies, nor is the use of interconnected loops cited. Thus again, there is no commonality with the specifics of the instant case.

U.S. Pat. No. 5,825,805, issued Oct. 20, 1998 to Ichiro Kato, describes a spread-spectrum modulation/demodulation technique similar to the orthogonal frequency-division multiplex (OFDM) scheme used in European DV-B digital television transmission. The inventor claims the advantage of very rapid synchronization of the code at the receiver by matching the frequency-spreading pattern, but the patent discloses no specific PLL circuits or detectors to recover sync information; indeed, an advantage is cited in that existing-art sync and data demodulators can be utilized on the despread output streams. Thus, again, there is no overlap with the subject of the instant application.

U.S. Pat. No. 5,493,583, issued Feb. 20, 1996 to Peter Cripps, discloses a wireless transceiver architecture employing a PLL-based frequency-multiplier to generate the transmit carrier. The salient feature of the system is a means of rejecting simultaneously transmitted data in the same unit's receiver by subtracting a portion of the transmitted data bitstream from the received stream after demodulation to minimize transmitter-to receiver crosstalk. However, no use of multiple and/or crosscoupled PLLs is mentioned, and no synchronization functions other than common art are included. There is once more no conflict with the instant invention.

U.S. Pat. No. 3,633,115, issued Jan. 4, 1972 to Marvin Epstein, is a fundamental patent predating the chip-type PLL which discloses a means of following the average phase of an input clock signal for smoothing timing within a logic system. The PLL error signal is heavily filtered to ignore rapid phase variations or jitter in the input signal but faithfully track long-term trends. This concept, while incorporated in nearly all modern PLL implementations, is clearly in the public domain.

U.S. Pat. No. 4,780,891, issued Oct. 25, 1988 to Jean-Pierre Guérin et al, describes a method and apparatus to approximately phase-synchronize two digital bitstreams by using the later as a reference and inserting a programmable logic-generated delay (within a selectable control window) into the path of the earlier-arriving stream. This technique does not employ any PLL hardware and thus is not relevant to the instant case.

U.S. Pat. No. 3,491,338, issued Jan. 20, 1970 to Francis Malloy, discloses a receiver data synchronizer built around adjustable multivibrator timing elements. A predetermined multi-bit preamble is sent with each data burst to facilitate proper decoding and to provide discrimination against atmospheric noise. Adjustment of the system is essentially manual, and no PLL or other automatic correction mechanism is included.

U.S. Pat. No. 5,519,444, issued May 21, 1996 to Yong Ko et al, discloses a phase-synchronizing apparatus for digital audio signals in digital-video applications which regenerates a data transmission clock using a PLL topology. The various selectable clock-frequency sets (keyed to the standard 48-, 44.1-, and 32-kHz audio sampling rates) are generated from edges of the input digital-audio data pulses and two groups of programmable PLL-type frequency dividers, one driven by a 21.333-kHz master reference clock and the other by an 18.432-kHz source. By selection of a multiplicity of the internal divide ratios, all the needed bit, frame, and sub-sampling rates for the 3 standard-rate digital audio streams can be generated. The two PLL systems are merely synthesizers and are cascaded to produce the desired frequencies, but they are not interconnected or used in an RF receiving function as in the systems of the instant invention.

U.S. Pat. No. 3,341,658, issued Sep. 12, 1967 to Hisashi Kaneko, discloses a matched-filter/correlator synchronization system for an RF receiver. This early development in correlation processing utilized tapped passive delay lines on the input and reference-waveform channels; the two signal sets were multiplied point-by-point and the sum used to correlate the received Barker-sequence encoded sync word with the identically encoded reference. At the peak of the correlation sum, the sync timing is probabilistically optimized, even in the presence of significant amounts of Gaussian noise. This patent, now obviously in the public domain, does not utilize multiple or interconnected PLLs of any kind and therefore does not impinge on the instant invention.

U.S. Pat. No. 4,545,061, issued Oct. 1, 1985 to Ronald Hileman, describes means for maintaining close receiver time synchronization in spread-spectrum and other correlation-type communication systems, even in low-SNR conditions. The basic sequence-correlation loop is equipped with a dithered local oscillator whose phase is perturbed periodically; the resulting dither modulations on the heterodyned received signal are coherently detected in a switched phase-inverter run at the same dither rate. The resulting dither-sideband energy is sent to two antiphase high-Q resonators, which are subsequently amplitude-detected in a diode bridge and low-pass filtered. The resulting bipolar error signal is then used to adjust the local correlator clock, which in turn tracks the received sequence phase and thereby achieves synchronization with what is conventionally known as a "tau-dither" loop. Since only one PLL is utilized, this patent does not relate to the instant case.

U.S. Pat. No. 5,402,450, issued Mar. 28, 1995 to Gary Lennen, discloses a complex scheme to subtract out multipath-induced errors from the satellite-based positioning signals received in a GPS receiver. In general, good multipath rejection is difficult to achieve except in spread-spectrum or other dispersive communications systems; even in these formats, multipath causes noticeable degradations in overall system performance. Succinctly, this technique is based on an understanding of the autocorrelation function (AF) of a spread-spectrum signal. In an ideal case, the AF is triangular when plotted against code-signal delay. The presence of multipath components in the received signal distorts and delays the peak of the AF (best correlation point), which causes an error when the AF is employed in a delay-lock loop (a form of PLL) to measure the precise code phase (and thus the pseudorange) from a GPS satellite. Although the implementation incorporates multiple delay-lock loops, they are operated in parallel and employ individual detectors for each loop; as a result, this patent does not overlap with the instant invention.

Finally, U.S. Pat. No. 5,739,727, issued Apr. 14, 1998 to Björn Lofter, et al, discloses a sampled PLL being locked with support from another (standard) PLL. The application is in a programmable frequency synthesizer which is desired to have fast switching and settling times and simultaneously exhibit low phase noise in the locked condition. Since in conventional PLL circuits, a fast response time requires a large control-signal bandwidth, this constraint is directly at odds with a low phase-noise level (requires heavy control-signal filtering and thus low bandwidth). The solution in this patent is, after switching the synthesizer to a new frequency, to pre-set the main PLL's initial frequency (using a fast digitally-sampled auxiliary PLL) to the desired value, thus affording rapid switching. To maintain the desired low phase noise, the main-PLL control voltage is severely filtered to limit its bandwidth; now that the main PLL control voltage is preset by the "helper" circuit to very close to its desired final value, the slow main-loop response will not degrade the system's overall switching/settling time specs. This concept, however, does not address receiver applications or multiply-interconnected PLLs; thus it is completely distinct from the instant invention.

While each of the foregoing may have some utility for the intended applications thereof, none of them directly address or effectively solve the problems noted initially above. For these reasons, there still remains room for improvement in the art.

SUMMARY OF THE INVENTION

It is an object of this invention to provide an improved digital-data receiver apparatus and method.

It is another object of this invention to provide a digital-data receiver apparatus and method wherein frequency and phase errors are minimized.

It is an object of this invention to provide a digital-data receiver and method having a synchronous design such that all internal reference frequencies are driven from a common source.

It is another object of this invention to provide a digital-data receiver and method in which problems associated with multiple "beat" components are eliminated.

It is a further object of this invention to provide a digital-data receiver and method in which all clock frequencies are integrally or fractionally related.

It is an even further object of this invention to provide a digital-data receiver and method in which the variable beat-rate pattern noise modulations within the system no longer occur.

It is an even further object of this invention to provide a digital-data receiver and method which exploits timing redundancies inherent in a typical data stream to concurrently but independently provide robust synchronization to all key frequencies embedded in the stream (i.e., bit, word, frame, burst rates) as well as related modulation (e.g., spread-spectrum chipping rates) and transmission (RF carrier frequency) parameters, even in poor communication channels.

It is an even further object of this invention to provide a digital-data receiver and method which results in a lower sustained bit-error rate in adverse receiving conditions by maintaining synchronization during intervals of degraded signal quality when conventional systems would fail.

It is an even further object of this invention to provide a digital-data receiver and method which results in a simpler lower-power logic design, lower gate counts and, thus, smaller chip areas and lower fabrication costs.

It is an even further object of this invention to provide a digital-data receiver and method for providing simplification of the related spread-spectrum receiver system hardware and improvement in its acquisition/lockup times, more reliable data-burst acquisition, and the facilitation of more robust receiver synchronization methodologies at the RF-carrier, chip, data-bit, frame, and burst levels.

It is a further object of this invention to provide a receiver in which the phase lock loop circuitry comprising synchronization loops for received data signals are mutually cross-coupled such that each loop is capable of providing to and receiving from each other loop a comparison or corrective signal with respect to frequency and/or phase, the comparison signal being used by the receiving loop to minimize or eliminate loss-of-signal or degradation of signal events such as those caused by noise, interference, signal fade, and the like.

These and other objects of the invention are achieved by an improved digital-data receiver synchronization apparatus having a plurality of memory devices for receiving multiple timing signals; and a feedback means interconnecting the memory devices and cross-coupling signals produced by the memory devices; wherein the receiver provides fast lock-up times and superior loss-of-lock protection in moderately to severely noisy conditions and has generally improved tolerances to clock asymmetries and channel-induced timing jitter.

Another object of the current invention is a method of providing improved digital-data receiver synchronization comprising the steps of: providing a plurality of memory devices for receiving multiple timing signals, each of the plurality of memory devices comprising a composite phase-frequency detector; and, interconnecting the memory devices with a feedback means for cross-coupling certain signals produced by the memory devices; wherein the receiver produces fast lock-up times in moderately to severely noisy conditions and avoids loss of lock in all but the most severe fading, interference, and/or multipath conditions.

These and other objects of the invention are also achieved by providing the described apparatus and method, wherein a common or master frequency reference source is used to provide timing signals to each of the memory devices.

BRIEF DESCRIPTION OF THE DRAWINGS

FIG. 4 is a schematic representation of the functioning of the exclusive-OR (XOR) detector and phase-frequency detector components of the current invention.

DETAILED DESCRIPTION OF THE INVENTION

Figure 1:
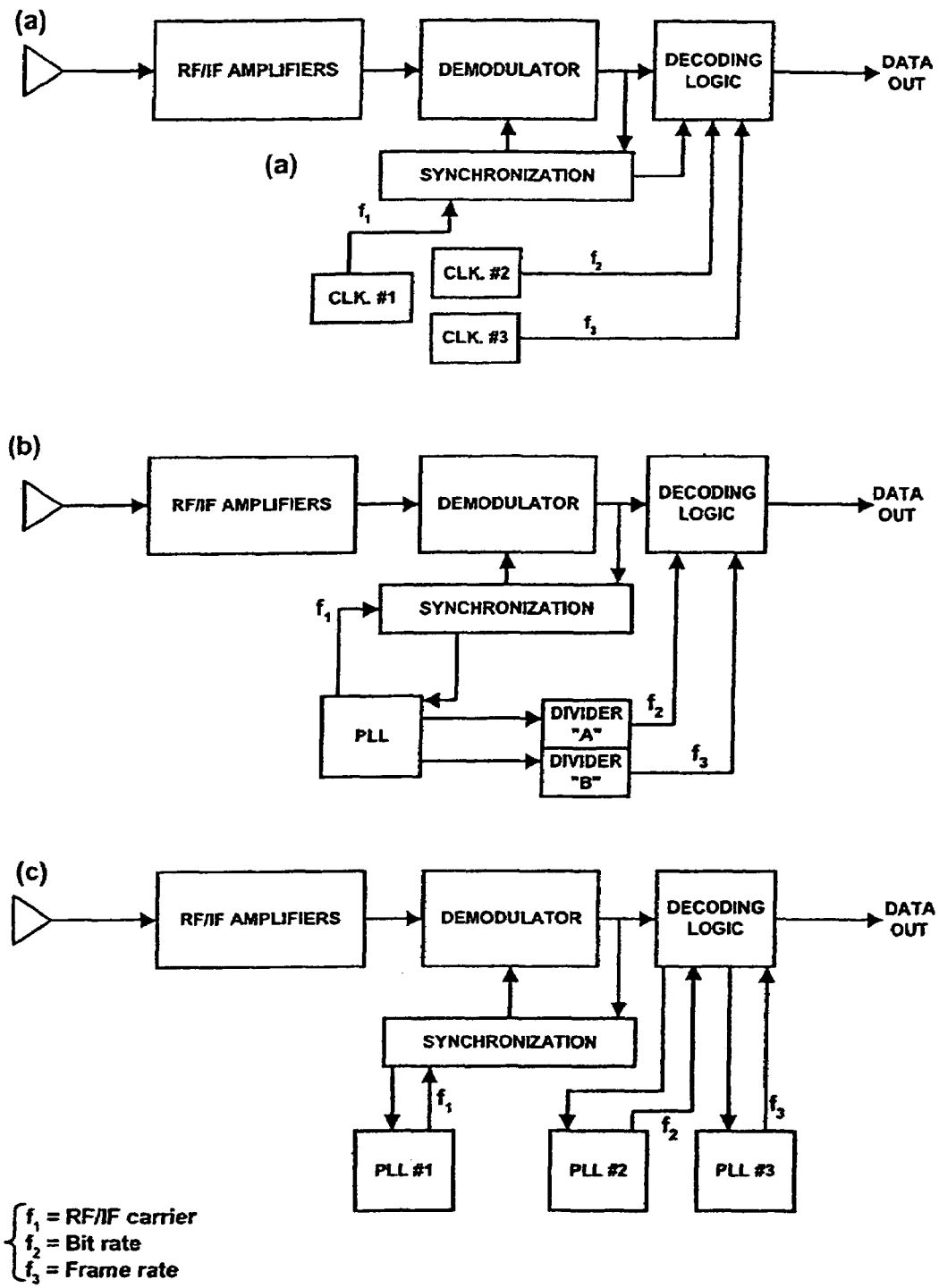
FIG. 1 provides block diagrams of three alternate forms of prior-art digital-data receiver clock synchronization.

The fundamental intent of the invention is, as described above, to exploit the timing structure in a typical digital data transmission by concurrently and corporately synchronizing (locking) to each of the salient timing components in the data stream. When one or more of these components is corrupted by noise, multipath, interference, or other channel degradations, the set of PLLs "fills in" the missing synchronization information by regenerating the necessary signal(s) from a combination of the remaining (uncorrupted) components.

While applicable to highly complex transmitter-receiver systems, the basic principles of the current invention may be generally explained by reference to a simple system. For the sake of simplicity, a transmitter is assumed to emit three types of data-related signals, each at a distinct frequency. These three signal-frequency components are the carrier, the data bit rate, and the data frame rate. A more complex system, to which the current invention is equally applicable, will also include additional timing signals such as the spread-spectrum chipping clock, transmission burst rate and other signals. These and other elements of a receiver are ignored for the purposes of this brief explanation.

A receiver for the transmitted data must simultaneously detect and match ("lock up" to) the frequencies (and, often, phases) of the carrier signal, the data bit rate signal, and the data frame rate signal. Currently, each of these signals will be at a different frequency derived from a clock means on the transmitter. In conventional receivers, clock means are required to generate timing signals to synchronize with each data signal such that the digital information may be extracted. Conventionally, the various clocks for these purposes are controlled by individual phase-locked loops (PLLs). As used herein, the term "phase-locked loop" or PLL is used to refer generally to include phase-locked loops, frequency-locked loops, delay-lock loops, signal correlators (including but not limited to spread-spectrum correlation detectors), and similar devices as known by those of skill in the art. Each PLL must generate a frequency to match or synchronize with the received frequency, such that the transmitted digital information may be derived. The PLLs in the receiver must first synchronize with, or lock up to, the received signal, and then must maintain the timing pulses such that the data may be read as it is received.

In low signal-to-noise environments, the initial lockup time for a PLL may be relatively long. Moreover, due to noise, interference, signal fading, and other sources of interference including those mentioned above, the lock may be lost and must be re-acquired. During periods of interference or noise, data is either not received correctly or is simply lost.

Conventional efforts to overcome these problems include increasing the power provided to the transmitter and/or receiver to increase the signal-to-noise ratio, or to add circuitry designed to condition the signals to improve acquisition or lock-up times and maintenance of the timing signal. Another solution basically requires the transmitter to transmit for a longer period of time such that lock-up time and signal loss do not prevent the reception of the transmitted data. Each of these efforts increases the cost of the system and/or its individual components due to the increased power requirements, increased complexity, and other incident factors.

One facet of the currently presented improvements for a digital-data receiver involves the use of composite phase-frequency detectors (CPFDs) for each, or as part of each, synchronization loop or PLL. The CPFD provides corrections for phase, frequency, or both, such that the operation of the PLL and hence the operation of the receiver is more robust.

In an additional aspect of the current invention, in relatively simple terms described in more detail below, the current invention overcomes the problems noted by providing mutual cross-coupling circuitry for each PLL or synchronization loop. In a most preferred form, the cross-coupling and the CPFDs are utilized together to achieve a significantly more robust reception of data than has been possible to date. The PLLs are interconnected with analog, digital, and/or mixed type feedback signals to cross-couple the respective error signals and output frequencies. The feedback provides a corrective or comparison signal from each PLL to each other PLL or synchronization loop. The cross-coupling circuitry can, and typically will, comprise conditioning circuitry, such as frequency multipliers or dividers and phase adjustments, to condition the comparison signal appropriately for the synchronization loop to which it is sent.

The cross-coupling, by providing a comparison signal, offers several significant advantages. The lock-up time for each synchronization loop will be decreased (lock-up speed increased). Also, each loop will be enabled to more robustly maintain the acquired frequency lock. The loop will therefore be able to function efficiently even in low signal-to-noise environments. Moreover, random noise spikes or interference can be ignored. With these and other advantages, power requirements are lessened and more complex conditioning circuitry is unnecessary. These advantages will be experienced in both the transmitter and receiver, thus reducing the costs, sizes, and complexities of transmitter/receiver systems.

The method and apparatus of the current invention may be used with both asynchronous and synchronous transmitter/receiver architectures. Currently, most systems are asynchronous, that is, each transmitted data signal receives its timing signal from an independent frequency source or clock means. In this case, the cross-coupling circuitry for the comparison signals can comprise conditioning circuitry whereby the frequency of the comparison signal is at or near the nominal frequency of the synchronization loop to which it is sent. Where the receiver is designed to correspond to one, or a plurality of identical transmitters, this circuitry may be hardwired. Where the receiver is designed for use with differing transmitters, the conditioning circuitry may be hardware- or software-programmable such that it can be appropriately varied.

The invention is most efficiently used with synchronous architecture, an example of which is disclosed in co-pending application Ser. No. 09/653,394, assigned to the assignee of this invention. In a synchronous transmitter, each component derives its timing signal from a single master clock, either directly or through simple multiplier or divider means. In a corresponding synchronous receiver, the cross-coupling circuitry is greatly simplified, because each synchronization loop derives its timing signal from the master clock either directly or through simple multiplier or divider means.

The implementation of the current invention provides substantial advantages. Power requirements can be reduced, as can circuit complexity. This provides savings in terms of both cost and the size of the components. Additionally, there are significant improvements in noise and interference rejection, effective system bit-error rates, the robustness of lock-up to the incoming signal, and the speed of acquisition in signal lock-up. A more detailed description of the invention, with exemplary circuit diagrams, is as follows.

Figure 2:
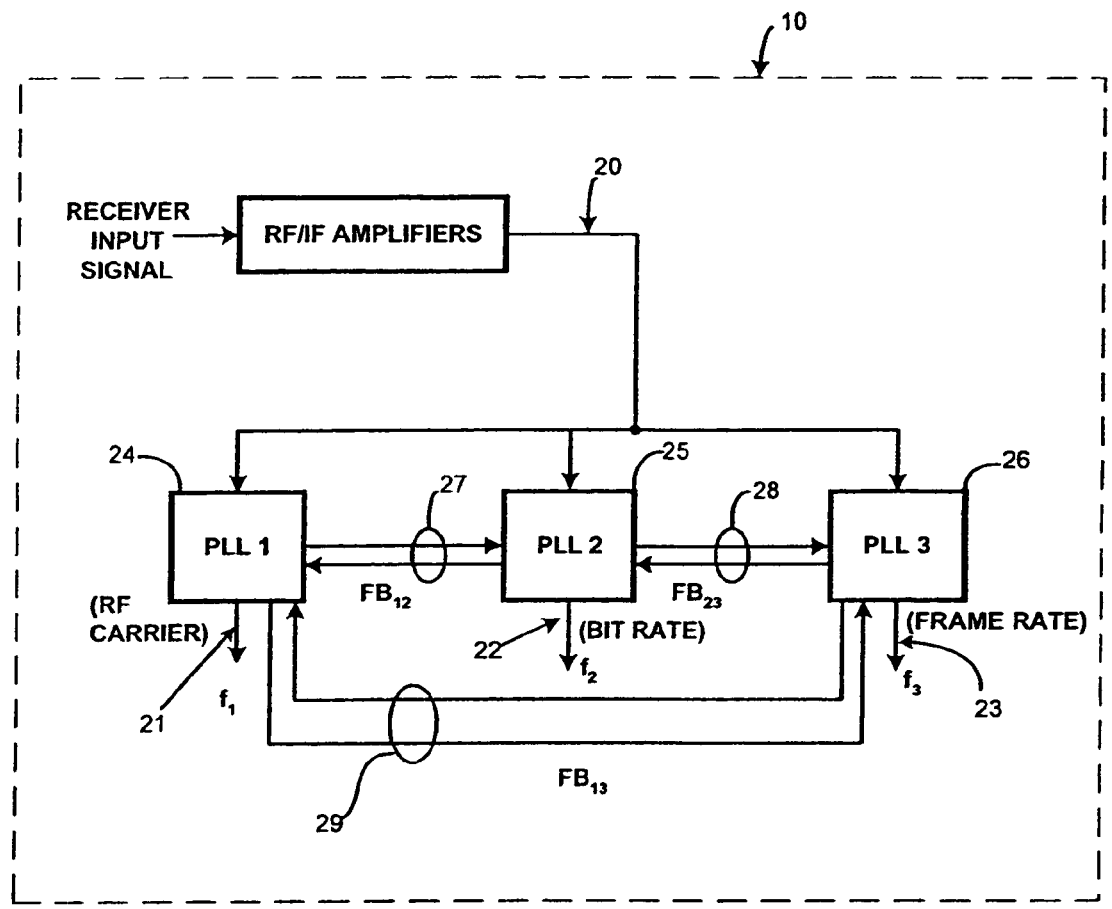
FIG. 2 is a block diagram of the basic functioning of the receiving system of the current invention.

FIG. 1 of the drawings provides typical block diagrams of receiver synchronization architectures according to the current-art techniques. FIG. 1(a) shows a basic scheme with a multiple unrelated clocks; 1(b) illustrates a single master PLL/clock with downstream dividers to generate the secondary frequencies; and 1(c) details three independent PLLs (one per frequency). FIG. 2 of the drawings is a typical block diagram of the basic functioning of the receiving system 10 of the current invention. As shown in FIG. 2, the receiving system 10 is designed to detect three distinct timing signals or frequencies of an input signal 20, such as the RF carrier $f_1$ 21, the data bit (baud rate) $f_2$ 22, and the data frame rate $f_3$ 23. In many instances there will be a need for additional timing signals to be regenerated, including but not limited to the spread-spectrum chipping clock, transmission burst rate, epoch clocks, and other timing markers. For purposes of illustration, however, only the three frequencies cited above will be utilized.

In conventional receivers, various clocks are derived from individual phase-locked loops (PLLs) or are derived from a single master loop synchronized to the RF carrier with downstream frequency-divider logic to generate the integrally related data and frame-rate clocks (FIG. 1). However, there is little noise immunity afforded with this arrangement because any noise in the bandpass of the data-modulated RF carrier signal will produce simultaneous jitter at all the derived clock frequencies and downstream phase-frequency detectors (PFDs) or other types of loop-phase detectors in the lower-speed derived loops.

To counter this effect, and concurrently provide faster lock-up times in moderately to severely noisy or distorted receiving conditions, the current invention provides a plurality of memory devices, for example $PLL_1$ 24, $PLL_2$ 25, and $PLL_3$ 26 shown in FIG. 2, which are mutually interconnected with bidirectional analog or digital feedback signals $f_{fb}$, such as $f_{fb}$ 27, $f_{fb}$ 28, and $f_{fb}$ 29, to cross-couple their respective error signals and/or output frequencies. Each memory device (for example, PLL 24, PLL 25, and PLL 26) is driven by one common source or clock using edge-triggered synchronous logic which generally affords improved tolerances to clock asymmetries, external EMI, propagation-delay variations, and supply and temperature changes. Additionally, the occurrences of random and varying-pattern digital "glitches" coupling into critical signal, control, and RF lines are significantly reduced.

Figure 3:
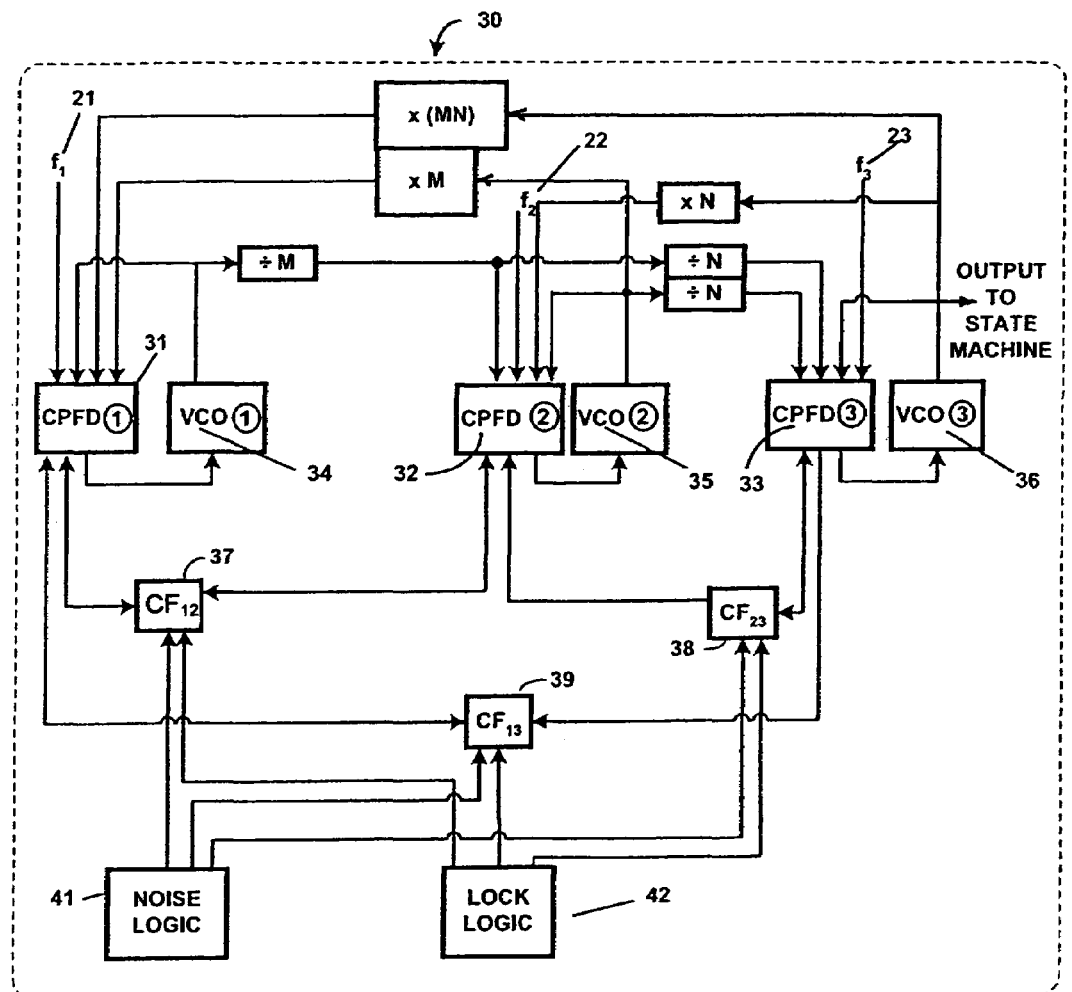
FIG. 3 is a schematic diagram of the interconnecting feedback logic employed by the multiple phase-locked loops (PLLs) of the current invention.

FIG. 3 is a schematic diagram of the feedback logic employed by the PLLs (for example, PLL 24, PLL 25, and PLL 26) of FIG. 2. As illustrated in FIG. 3, the preferred embodiment of the current invention incorporates a system of multiple cross-coupled synchronization loops 30. The loops 30 include multiply-divide feedback logic. As such, $f_1$ 21, $f_2$ 22, and $f_3$ 23 are provided as precise integral (or fractional) multiples or sub-multiples of each other with predetermined phase relationships. The relationship of the signals $f_1$ 21, $f_2$ 22, and $f_3$ 23, as provided in a preferred embodiment of the current invention, is set forth below.

$$f_1 = M \cdot f_2 = M \cdot N f_3 \qquad (1)$$

$$f_2 = N \cdot f_3 \qquad (2)$$

$$M = f_1 \div f_2 \qquad (3)$$

$$N = f_2 \div f_3 \qquad (4)$$

Here, M and N are integers (in general, any positive rational numbers) limited only in practical applications by logic speeds, power, and phase-noise considerations. Each signal $f_1$ 21, $f_2$ 22, and $f_3$ 23 is then fed to its respective composite phase-frequency detector (CPFD), for example $CPFD_1$ 31, $CPFD_2$ 32, and $CPFD_3$ 33, which measures the overall phase and frequency error in each loop and provides a corrective signal to its associated voltage-controlled oscillator (VCO), for example $VCO_1$ 34, $VCO_2$ 35, and $VCO_3$ 36. Crossfeed circuits $CF_{12}$ 37, $CF_{23}$ 38, and $CF_{13}$ 39 provide conditioned analog control-voltage interconnects between the designated CPFD blocks. These crossfeeds are, in a preferred implementation, controlled by a pair of computational blocks, labeled "Noise Logic" 41 and "Lock Logic" 42, which respectively evaluate the noise level of the key incoming signal components and assess the stability of each loop's error voltage. If the input noise to a given loop is excessive, the Noise Logic block senses the condition, either via a simple input-signal amplitude measurement, a frequency-jitter assessment (described below), a pulse-width limiting status level, or other means. The Lock Logic circuitry, meanwhile, senses the lock status of each related PLL via error-voltage measurements (also detailed below), evaluations of the PFD phase-pulse output signals, XOR-detector average-voltage monitoring, frequency-jitter characterizations, or other means.

For completeness, FIG. 4 is a schematic representation of the functioning of the standard exclusive-OR (XOR) gate phase detector and of the conventional phase-frequency detector (PFD) used within the current invention. The output of the XOR gate is low (output= 0) whenever an input A and input B are the same, i.e., either both "high" or both "low". This operation may be seen as in Table 1 below, where the logical equation is A⊕B=Z, Z being the XOR output.

TABLE 1

| Input A | Input B | XOR Output |
|---|---|---|
| 0 | 0 | 0 |
| 0 | 1 | 1 |
| 1 | 0 | 1 |
| 1 | 1 | 0 |

The corresponding waveforms and operational details for the standard PFD-type detector are also provided, for reference, for a commercial 74HC4046 integrated-circuit chip.

Figure 5:
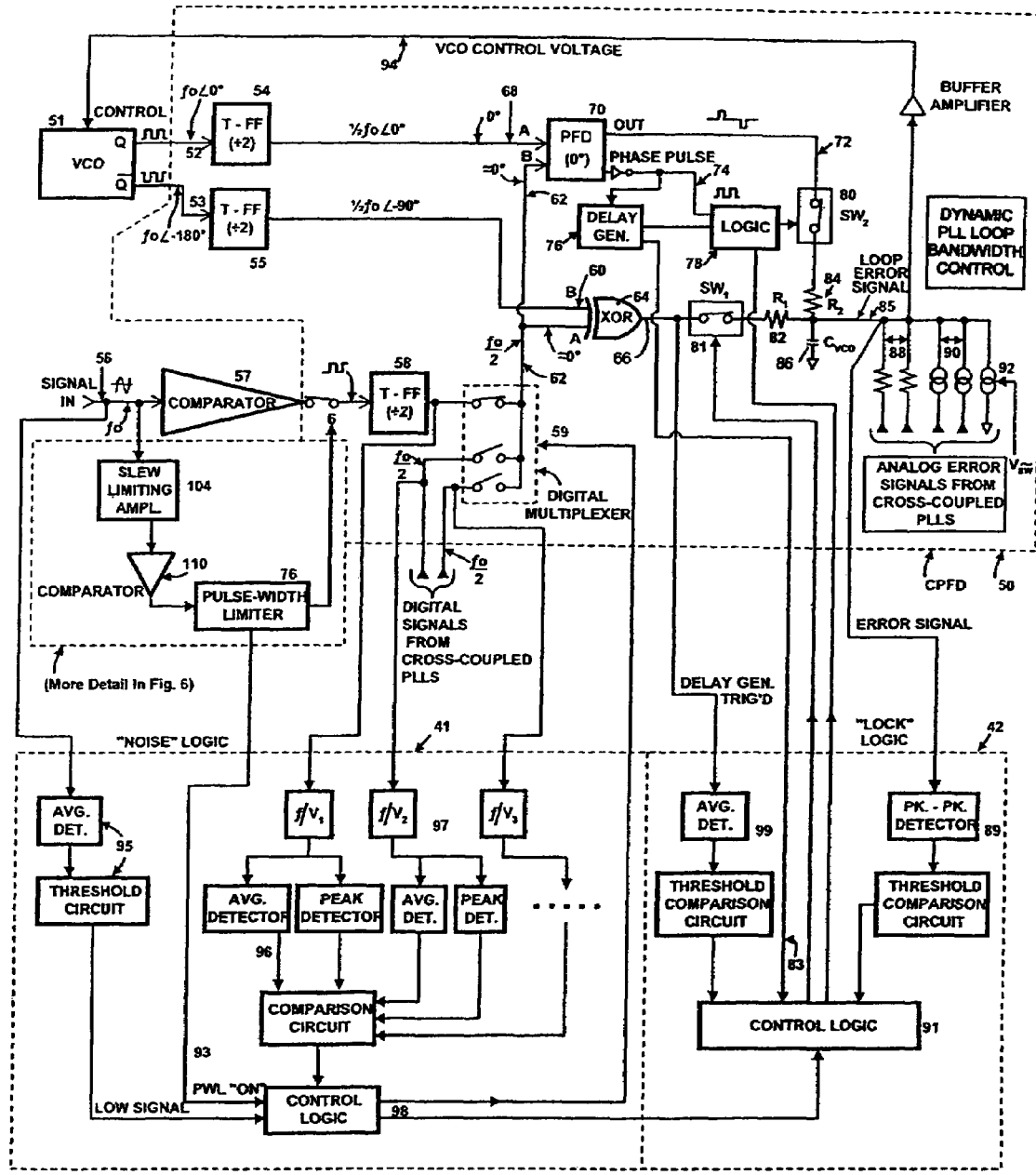
FIG. 5 is a schematic diagram representing the preferred embodiment of the composite phase-frequency detectors of the current invention.

FIG. 5 is a schematic diagram representing the preferred embodiment of the CPFD circuitry 50 utilized in, for example, CPFD$_1$ 31, CPFD$_2$ 32, and CPFD$_3$ 33 as they are shown in FIG. 3. The CPFD circuitry 40 used in the current invention incorporates a standard-format phase-frequency detector (PFD) circuit, but augmented to provide greatly improved noise immunity and to provide means for introducing the cross-coupled signals extracted from the other (here, two) loop detectors. The system shown possesses the familiar advantages of the classic phase-frequency detector over other types—namely, larger (±360°) tracking range, much improved lock, pull-in, and pull-out ranges, low average phase error in lock, rapid frequency acquisition, and freedom from harmonic-frequency locking. In addition, though, the CPFD circuit 50 at lock also exhibits the quite low loop-phase jitter and noise heretofore reserved to analog and XOR-type detectors.

A complete PLL subsystem particularly suitable for the RF receiver application is included diagrammatically in FIG. 5. The PLL is an electronic circuit for locking an oscillator, such as a VCO, in frequency and/or phase with an arbitrary input signal which is employed to track a carrier or synchronizing signal which itself may vary in frequency and/or phase with time. Performance of the PLL is dependent on the circuit's ability to accurately control the frequency and phase of the VCO output. Reference inputs $f_{r1}$ 52 and $f_{r2}$ 53 are provided to the CPFD at a memory device(s), preferably divide-by-two flip-flop 54 and flip-flop 55, respectively. Typically, these inputs are differential or opposite-phased; i.e., as from the main (Q) and inverted (Q') outputs of a flip-flop or square-wave oscillator (usually the loop VCO itself). Variable-frequency input $f_v$ 56 is introduced into the CPFD at noninverting comparator 57. From the comparator 57, the squared-up signal (still at $f_v$) proceeds to a further memory device in the CPFD circuitry, preferably divide-by-two flip-flop 58. Upon leaving the flip-flop 58, the output (now at ½ $f_v$) is provided to another type of gating device, such as digital multiplexer 59. Digital multiplexer 59, at the direction of the "Noise" and "Lock" logic blocks, selects either ½ $f_v$ or one of the same-frequency digital references from the other cross-coupled PLLs for input into the XOR gate 64 along with $f_{r2}$ 60 from flip-flop 55. The flip-flops 54 and 55 are configured to feed the XOR gate 64 so that the input waveforms both have a duty cycle of precisely 50% and are presented in the proper 90-degree phase relationship so that at lock the desired half-scale average (DC) output level [$V_{vco}$] is generated on the loop capacitor $C_{vco}$ 86. When the CPFD is locked in, the positive transition of the reference input $f_{r2}$ 60 and the multiplexer 59 output 62 are equal in frequency and have a phase difference of very nearly 90 degrees. Under these conditions, the logic outputs of the logic blocks will be high, causing the XOR gate 64 output on line 66 to be switched through SW$_1$ 81 to resistor R$_1$ 82 and thence to the output of the CPFD 85. Under lock, the duty cycle of the XOR output 66 will be 50% and the output frequency will be equal to twice the input frequency. Any change in phase will result in a linear (but small) change in duty cycle, until the loop is rebalanced.

The output 68 from flip-flop 54 and multiplexer 59 are also provided to a standard (but augmented) phase-frequency detector 70. PFD 70 provides both an output 72 and a phase-pulse signal 74. Phase-pulse signal 74 is provided to a pulse-width limiting device, such as a gated delay generator; this could be either a counter, a standard monostable multivibrator ("one-shot"), or another implementation. In a preferred embodiment of the current invention, the standard PFD circuit is augmented by a one-shot 76 which is fed from the phase-pulse output 74 of the phase-frequency detector circuit 70. A negative-going phase pulse is generated in the conventional PFD 70 (e.g., as incorporated in a type 74HC4046 CMOS PLL chip) to indicate when the main detector 70 pulses (both positive and negative) are generated and applied to the output pin 72 and thence to the loop filter capacitor $C_{vco}$ 86, which in turn integrates the current pulses and stores the VCO loop error voltage.

Alternatively, the logic "high" intervals of this signal 74 can be viewed as an indicator of the "tri-state" cutoff condition of the main output between pulses. The PFD 70 is an edge-triggered device and is therefore more susceptible to untimely short noise pulses than the lower-performance XOR detector (64), which tends to average them out. The one-shot 76 serves to limit the output pulse widths applied to the loop capacitor $C_{vco}$ 86 and thus, once the loop is locked, "blanks out" the detrimentally long pulses normally produced by the standard PFD circuit in response to input-signal noise spikes.

To maintain stable loop lock during the noise intervals, the PFD output at 74 is combined via resistive current summing through R$_2$ 84 at node 85 with the square-wave output from XOR detector 64 through R$_1$ 82. Switch SW$_2$ 80 is provided to disable the output of the CPFD circuitry when a large noise spike is received which would threaten the locked state of the circuit. The logic driving switch SW$_2$ 80 detects any loss of loop lock; if so, the output of the PFD 72 is disconnected from the control node 85. Switch 80 thus operates to protect the local VCO (as well as the cross-connected PLL circuits) from being disturbed by noise spikes by providing a holding action on the loop control voltage during noise intervals and thereby avoiding even a transient loss of lock. The filtered output from XOR 64 then "bridges through" noise pulses and keeps the loop tightly controlled while the potentially unstable phase-frequency detector 70 signals are switched out by 80 until the noise subsides. The cross-fed analog or digital error and/or frequency signals from the other system CPFDs, such as provided at resistors 88 and 90, may be injected either by a resistive or direct current-summing technique at the actual control nodes (as shown) or by replacing the digital VCO or input comparator signals (using a digital multiplexer as at 59) during the disturbance. These error signals are further provided to the VCO. The CPFD circuitry 50 may also include a programmable bandwidth (time-constant) control, such as shown in $V_{bw}$ 92.

In an alternate embodiment, a voting-logic methodology may be implemented via analog circuitry (e.g., with simple averaging, comparisons, or more elegant median computations), via digital means (e.g., pulse counting, majority logic, or blanking), or even via software programs run on microcomputer or DSP systems.

The preferred embodiment of the CPFD 50 as above also provides lower levels of loop jitter in the locked state by using the stable XOR output to increase the effective quiescent loop gain at lock over that attainable from the standard PFD alone. This latter problem is caused by the normal PFD's well known loss of gain at lock due to its inability to output arbitrarily narrow pulses which would ideally be generated by the PFD circuits under near-zero loop error conditions. This reduction in effective PLL loop gain then permits an undesirable increase in jitter at the PFD's quiescent point and represents a finite limit in the ability of the receiver to suppress data bit errors, even when the input signal-to-noise ratio (SNR) is quite high. The current invention remedies this shortcoming as well, and thus lowers the ultimate receiver bit-error rate (BER) figure below that attainable with current-art technology.

Figure 6:
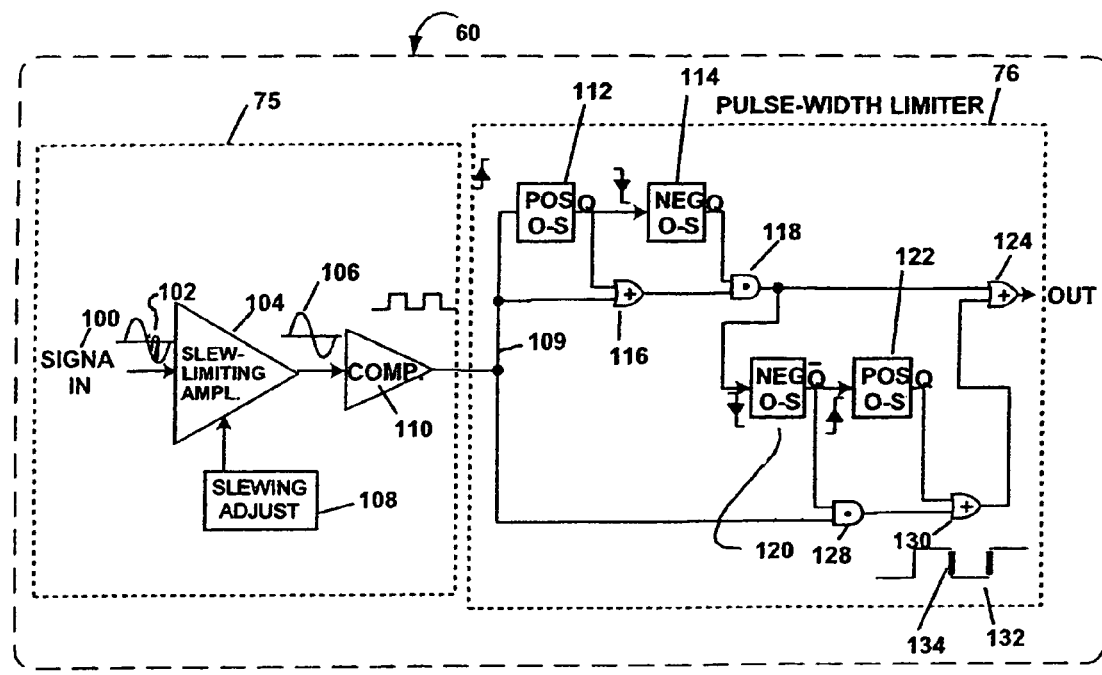
FIG. 6 is a schematic representation of the functioning of the input-signal noise suppression component of the current invention.

FIG. 6 is a schematic representation of the functioning of an optional input-signal noise-suppression component 60 of the current invention. As shown, a first input signal 100 is provided to a signal-conditioning device 75, comprising an amplifier such as a gain-controlled slew-limiting amplifier 104. First input signal 100 may contain a noise spike 102 as shown. The gain-controlled slew-limiting amplifier 104, which incorporates a peak-sensing automatic gain-control (AGC) function to provide a constant output level, also operates by known methods to detect the rate of change of the signal 100 (in voltage or current per second) and will only follow a signal whose rate of change is below a particular level. The slew-limiter 104 is designed to minimize extraneous signal zero-crossings and thereby control the intervals of signal transitions at the output 110 of the downstream comparator 109. The slew-limiter will allow the actual signal to vary only slightly from the predicted or anticipated waveform, thereby eliminating loop upsets or even false synchronizations possibly caused by large noise excursions in its input 100.

As is shown, the output 106 of the slew-limiter 104 no longer contains the noise spike. The slew limiter 104 may be adjusted, such as by a slewing adjuster 108, to a desired rate of change to be detected and allowed by the circuit. (In practice, this is commonly accomplished by regulating the bias current available at the node containing the dominant response pole of an amplifier; the current level divided by the node capacitance equals the slew rate in volts per second.) The output of the slew-limiter 104 is provided to a zero-crossing comparator 110 (typically implemented with hysteresis) and further to the dual one-shot 76 for limiting the pulse width of the output signal. The circuit will allow the signal to vary somewhat, as shown by the gray (shaded) areas 134 of the square wave. The pulse-width limiter, or one-shot 76, takes the output of the comparator and performs various logical functions depending on whether the signal is in a positive alternation (as at memory devices 112 and 122) or a negative alternation (as at memory devices 114 and 120). For example, a square-wave signal 109 is provided into the one-shot 76. The signal 109 is divided such that a portion of the signal is provided to an edge-triggered memory device (one-shot) 112, which provides an output upon detecting the positive-going edge of signal 109. The output signal from device 112, which remains "high" for an interval equal to the minimum permissible signal 110 positive-alternation duration, is split such that the signal is provided to edge-triggered one-shot 114 as well as to XOR gate 116. An output from gate 116 as well as an output from one-shot 114 is provided to AND gate 118, which produces an output signal which serves as an input to edge-triggered one-shot 120 and to final XOR gate 124. One-shot 120 provides output (equal in duration to the minimum acceptable negative input-signal duration) upon detecting the negative-cycle edge of the signal 110. Memory device 120 provides output to AND gate 128 as well as to edge-triggered one-shot 122. AND gate 128 receives a further input from the squared-up original signal at 109, which is then compared with the signal from one-shot 120 to produce an output to feed XOR gate 130. The second input to XOR gate 130 is provided by the output of one-shot 122. XOR gate 130 provides input to a final XOR gate 124, along with the output of XOR gate 118. XOR gate 124 provides the filtered logic output of the noise-suppressor 60, which as a unit is intended to be used as an alternate for the signal-input block 52 and standard comparator 54 of FIG. 4. The effective function of the circuit 60 is simply to constrain both positive and negative periods of the "square" wave at 132 to selected minimum and maximum values, typically within roughly 1–5% of their nominal periods. This action inhibits or "filters out" unusually large noise excursions even before they reach the CPFD circuits of 40.

Figure 7:
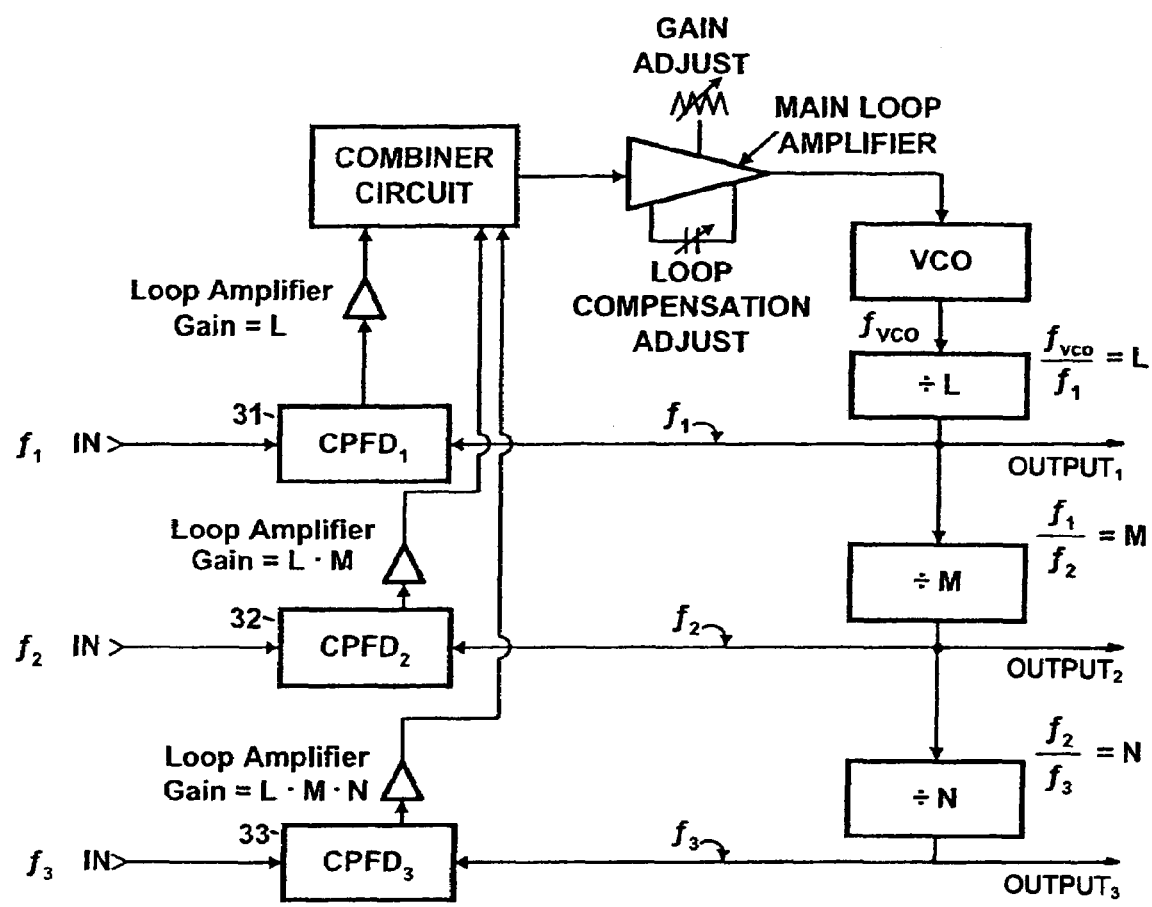
FIG. 7 is a block diagram of a simplified embodiment of the current invention utilizing only a single VCO driven by a combination of three of the composite phase-frequency detectors.

In another, distinct form of the invention, a single VCO can be controlled by a combination of several detectors, such as depicted in FIG. 7. Here, much as in the multiple-PLL version of FIG. 3, the three basic system frequencies are related by the same factors $f_1, f_2 =$ M and $f_2, f_3 =$ N; also, in general, the VCO frequency may be greater than $f_1$ by the factor of L, such that the main VCO frequency is given by:

$$f_{vco} = f_1 \cdot L$$

In this simplified arrangement, the three CPFDs are combined with the guidance of the aforementioned "noise" and "lock" logic blocks and specialized selection processing to assure that a stable control voltage is fed to the VCO under all receiving conditions. Thus, the probability of loss of loop lock (and data errors) is continually minimized. Although this configuration is not quite as robust as the preferred embodiment of FIG. 3, it has a potentially significant complexity and cost advantage by only requiring the single system VCO unit. The combining mechanism may be as simple as a switched summing network, where the active detector signals are scaled and added; any unstable signals therein are deleted from the output sent to the VCO control point.

In general, the use of edge-triggered synchronous logic in both transmitter and receiver affords improved tolerance to clock asymmetries, external EMI, propagation-delay variations, supply and temperature changes, and reduces the occurrences of random or varying-pattern digital "glitches" coupling into critical signal, control, and RF lines. Another major advantage of this synchronous system approach lies in the simplification of the related (spread-spectrum or conventional) receiver hardware [particularly in the need for fewer oscillator modules] and a significant improvement in the acquisition/lockup times, more reliable data-burst acquisition (particularly in noisy receiving conditions) and the facilitation of more robust receiver synchronization methodologies at the RF-carrier, chip, data, frame, and burst levels.

These attributes are key to the implementation of future complementary low-cost monolithic RF digital-data receiver devices. It is thus seen that a novel digital-data receiver and method have been described, the receiver having a synchronous design such that all internal reference frequencies are driven from a common source. In the current invention, prior-art problems associated with multiple "beat" components are eliminated by providing clock frequencies which are integrally or fractionally related such that variable beat-rate pattern noise modulations within the system no longer occur. This invention results in a simpler, lower-power logic design, lower gate counts and, thus, smaller chip areas and lower fabrication costs. Additionally, the digital-data receiver and method provide simplification of the related spread-spectrum receiver system hardware and an overall improvement in its acquisition/lockup times, more reliable data-burst acquisition and the facilitation of more robust receiver synchronization methodologies at the RF-carrier, chip, data-bit and burst levels.

In summary, in a preferred embodiment, the current invention differs fundamentally from the prior art in that heretofore the several discrete clock frequencies used in a receiving system would usually be generated from individual oscillators (normally) or in special setups (where all the frequencies were integrally or fractionally related) from a single reference clock oscillator. In the first case, the independent frequencies did not track at all. Even in the latter case, where the different derived clocks were synthesized from the master oscillator via individual frequency-divider logic chains, these separate frequencies were all forced to "track" the main reference and would concurrently deviate from their intended values when the main reference signal-acquisition loop lost lock due to noise or other disturbances. In the current method, each system frequency source is stabilized by its own PLL subsystem, which operates more-or-less independently of the others until a significantly large disturbance occurs which causes one or more of these individual loops to unlock. When this happens, the various PLL error signals are via specialized interconnection means compared with one another. An analog, digital, or combination (hybrid) logic circuit then applies appropriate correction signals to the out-of-lock PLLs to restore them to a normal locked state (generally indicated by a sufficiently small loop error-voltage amplitude and/or ripple-frequency spectrum). A "voting" scheme is typically included to assure stable system locking when more than one of the internal PLLs is driven out of lock; further, fail-safe logic provides for proper system synchronization if even just one of the loops is operating in a locked condition. Failing that, one or more auxiliary system reference oscillators which are continually (periodically) being updated by the system can be used to "bridge" the synchronization dropout interval using similar comparison-logic means.

It is well known to those of skill in the art that circuitry components intended to perform identified tasks can vary at both the transistor level and at even higher levels. It will therefore be understood that the circuit diagrams and descriptions thereof set forth herein are exemplary. In addition, it is also well known that many aspects of the circuitry of the current invention can be controlled by software, either integrated into the circuitry or through an input means to the circuitry and devices, and/or by programmable hardware. Use of such software or hardware may be desired where there are both sufficient resources and a need for greater flexibility of specific applications. Where such flexibility is not needed, the circuitry described herein can be largely or entirely fixed.

It will, therefore, be readily understood by those of skill in the art that the current invention is susceptible of broad utility and application. Many embodiments and adaptations of the current invention other than those described, as well as many variations, modifications, and equivalent arrangements, will be apparent from or reasonably suggested by the current invention and foregoing description thereof, without departing from the substance or scope of the current invention as defined by the following appended claims.

What is claimed is:

1. An improved digital-data receiver synchronization apparatus comprising:
a plurality of memory devices for receiving multiple timing signals;
feedback means interconnecting said memory devices and cross-coupling signals produced by said memory devices; and
a common frequency reference source in communication with said plurality of memory devices for driving said plurality of memory devices,
wherein said multiple timing signals satisfy the relationship $$f_1 = M \cdot f_2 = M N f_3$$

wherein $f_1$ is said RF signal; $f_2$ is said data bit rate signal; $f_3$ is said data frame-rate signal; and M and N are positive rational numbers.

2. An improved digital-data receiver synchronization apparatus comprising:
a plurality of memory devices for receiving multiple timing signals;
feedback means interconnecting said memory devices and cross-coupling signals produced by said memory devices; and
a common frequency reference source in communication with said plurality of memory devices for driving said plurality of memory devices,
wherein said common frequency reference uses edge-triggered synchronous logic.

3. An improved digital-data receiver synchronization apparatus comprising:
a plurality of memory devices for receiving multiple timing signals, at least one of said plurality of memory devices comprising a composite phase-frequency detector;
a common frequency reference source in communication with said plurality of memory devices for driving said plurality of memory devices; and,
a feedback means interconnecting said memory devices and for cross-coupling certain signals produced by said memory devices,
wherein said multiple timing signals satisfy the relationship:

$$f_1 = M f_2 = M N f_3$$

wherein $f_1$ is said RF signal; $f_2$ is said data bit-rate signal; $f_3$ is said data frame-rate signal; and M and N are positive rational numbers.

4. An improved digital-data receiver synchronization apparatus comprising:
- a plurality of memory devices for receiving multiple timing signals, at least one of said plurality of memory devices comprising a composite phase-frequency detector;
- a common frequency reference source in communication with said plurality of memory devices for driving said plurality of memory devices; and,
- a feedback means interconnecting said memory devices and for cross-coupling certain signals produced by said memory devices,
- wherein said common frequency reference uses edge-triggered synchronous logic.

5. An improved digital-data receiver synchronization apparatus comprising:
- a plurality of memory devices for receiving multiple timing signals, at least one of said plurality of memory devices comprising a composite phase-frequency detector;
- a common frequency reference source in communication with said plurality of memory devices for driving said plurality of memory devices; and,
- a feedback means interconnecting said memory devices and for cross-coupling certain signals produced by said memory devices,
- wherein said composite phase-frequency detector further includes at least one device selected from the group consisting of a switch; a relay; a digital trigger (T) flip-flop; a digital divider; a nonlinear element; an analog divider; a square-root circuit; a comparator; a frequency-to-voltage converter; a frequency-to-current converter; a digital AND gate; a digital OR gate; a digital XOR gate; a digital counter; a digital J-K flip-flop; a digital R-S flip-flop; a majority-logic circuit; a peak detector; an average detector; a root-mean-square (RMS) detector; an operational amplifier; a follower circuit; a logic array device; a microprocessor; a digital state machine; a neural network; a digital signal processor (DSP) device; and an analog signal processor (ASP) device.

6. An improved digital-data receiver synchronization apparatus comprising:
- a plurality of memory devices for receiving multiple timing signals, at least one of said plurality of memory devices comprising a composite phase-frequency detector;
- a common frequency reference source in communication with said plurality of memory devices for driving said plurality of memory devices; and,
- a feedback means interconnecting said memory devices and for cross-coupling certain signals produced by said memory devices,
- wherein said composite phase-frequency detector comprises a timing device for limiting the detector signal pulse widths.

7. An improved digital-data receiver synchronization apparatus comprising:
- a plurality of memory devices for receiving multiple timing signals, at least one of said plurality of memory devices comprising a composite phase-frequency detector;
- a common frequency reference source in communication with said plurality of memory devices for driving said plurality of memory devices; and,
- a feedback means interconnecting said memory devices and for cross-coupling certain signals produced by said memory devices,
- wherein said composite phase-frequency detector further comprises at least one device selected from the group consisting of: a monostable multivibrator; a delay generator; a digital counter; a logic gate; a switch; a digital state machine; a pulse width-to-voltage converter; a pulse width-to-current converter; an integrator; a comparator; and a pulse width-limiting circuit.

8. An improved digital-data receiver synchronization apparatus comprising:
- a plurality of memory devices for receiving multiple timing signals, at least one of said plurality of memory devices comprising a composite phase-frequency detector;
- a common frequency reference source in communication with said plurality of memory devices for driving said plurality of memory devices; and,
- a feedback means interconnecting said memory devices and for cross-coupling certain signals produced by said memory devices,
- wherein said composite phase-frequency detector further comprises an input-signal rate-limiting amplifier whereby said composite phase-frequency detector will not follow a signal having oscillations above a predetermined rate of change.

9. The improved digital-data receiver synchronization apparatus of claim 8, wherein said rate of change is measured in voltage (volts) per second.

10. The improved digital-data receiver synchronization apparatus of claim 8, wherein said rate of change is measured in current (amps) per second.

* * * * *